United States Patent [19]
Masuta

[11] Patent Number: 5,952,883
[45] Date of Patent: Sep. 14, 1999

[54] CIRCUIT ARRANGEMENT FOR AMPLIFYING AN ELECTRICAL SIGNAL CONVERTED FROM AN OPTICAL SIGNAL

[75] Inventor: Tomoaki Masuta, Tokyo, Japan

[73] Assignee: NEC Corporation, Tokyo, Japan

[21] Appl. No.: 08/957,928

[22] Filed: Oct. 27, 1997

[30] Foreign Application Priority Data

Oct. 25, 1996 [JP] Japan ..................................... 8-284329

[51] Int. Cl.⁶ .............................. H03G 3/10; H03F 1/36; H04B 10/06; H01J 40/14
[52] U.S. Cl. ........................... 330/279; 330/86; 359/194; 250/214 AG
[58] Field of Search .............................. 330/282, 86, 133, 330/59, 308, 279, 129, 134; 359/194; 250/214 AG

[56] References Cited

U.S. PATENT DOCUMENTS 4,378,527  3/1983  Beauducel et al. ........................ 330/86
4,704,584  11/1987  Smither ..................................... 330/86

FOREIGN PATENT DOCUMENTS

9-8563   1/1997   Japan .

*Primary Examiner*—Robert Pascal
*Assistant Examiner*—Patricia T. Nguyen
*Attorney, Agent, or Firm*—Sughrue, Mion, Zinn, Macpeak & Seas, PLLC

[57] ABSTRACT

In order to effectively amplify an electrical signal converted from an optical signal, first and second amplifiers are coupled in series. A controller is arranged such as to receive outputs of the first and second amplifiers and to produce first and second control signals based on the outputs. The first and second amplifiers respectively change gains thereof in response to the first and second control signals. The output of the second amplifier is an output of the arrangement.

9 Claims, 12 Drawing Sheets

CASE 1 OF FIG.5

CASE 2 OF FIG.5

CIRCUIT ARRANGEMENT FOR AMPLIFYING AN ELECTRICAL SIGNAL CONVERTED FROM AN OPTICAL SIGNAL

BACKGROUND OF THE INVENTION

1. Field of the Invention

The present invention relates generally to an amplifier, and more specifically to an electronic circuit for amplifying a signal converted from an optical signal transmitted in burst.

2. Description of the Related Art

It is known in the art to make use of a transimpedance amplifier for amplifying a very small electrical current signal which has been converted from an optical signal using a photoelectric cell such as a photodiode. Such kind of conventional transimpedance amplifier is disclosed in Japanese Laid-open Patent Application No. 9-8563.

Figure 1:
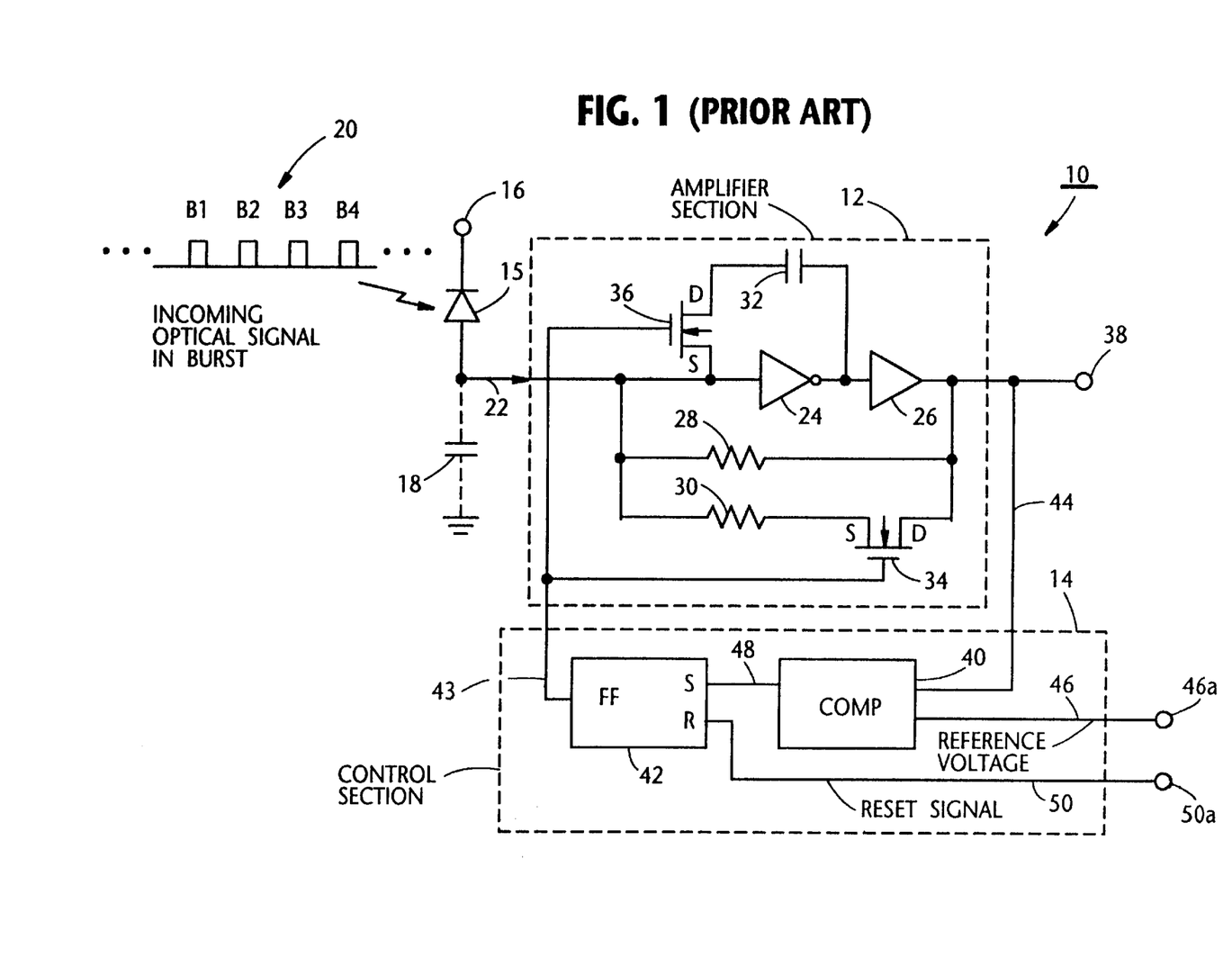
FIG. 1 is a block diagram showing a conventional amplifier, having discussed in the opening paragraphs of the instant disclosure.
Figure 2:
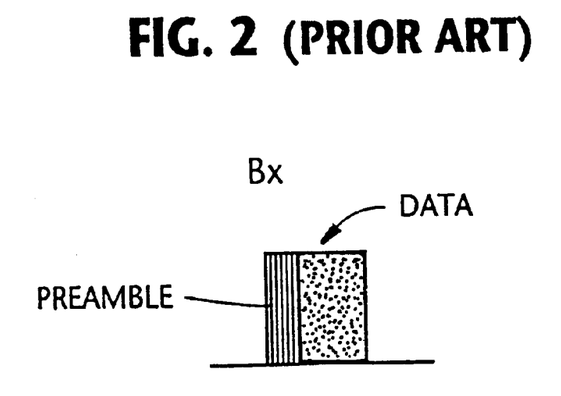
FIG. 2 is a diagram schematically showing a format of one typical optical burst.
Figure 3:
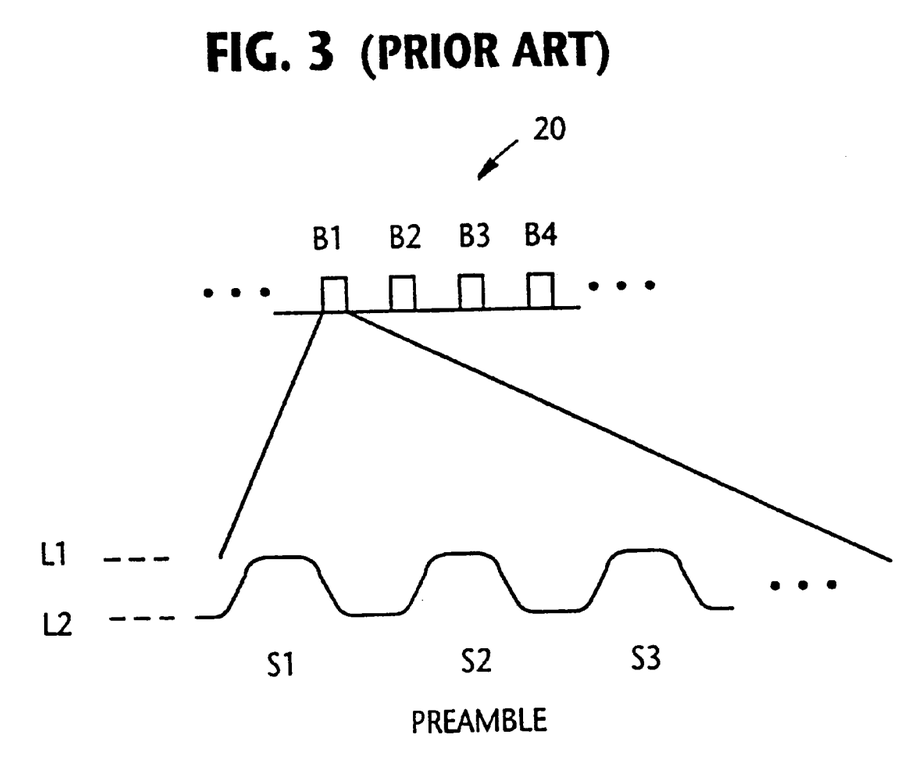
FIG. 3 is a sketch showing three preamble pulses which are included in an optical burst signal and precede data.

Prior to turning to the present invention, it is deemed advantageous to briefly discuss, with reference to FIGS. 1 to 3, the above mentioned conventional amplifier.

The amplifier, generally denoted by reference numeral 10, includes an amplifier section 12 and a control section 14. A photodiode 15 has the cathode thereof coupled to a power supply terminal 16. Reference numeral 18 denotes a stray capacitance between the anode of the diode 15 and the ground. As schematically illustrated, an incoming optical signal 20 includes a plurality of burst signals B1, B2, B3, B4, . . . transmitted at predetermined time intervals over an optical fiber (not shown). The optical signal 20 is then converted, at the photodiode 15, to a corresponding electrical current signal 22 which is applied to the amplifier section 12.

The amplifier section 12 comprises an inverting amplifier 24, a buffer 26, two feedback resistors 28 and 30, a phase compensating capacitor 32, and two N-channel MOS transistors 34 and 36 each of which functions as a switch. Such a MOS transistor is interchangeably referred to as a switch. On the other hand, the control section 14 is comprised of a comparator 40 and a set/reset type flip-flop (hereinafter sometimes referred to as FF) 42.

Referring to FIGS. 2 and 3, the optical signal 20 is shown in more detail. As shown in FIG. 2, each burst signal comprises a preamble which is a pattern of reversals, 101010 . . . , repeated for a predetermined time duration. The preamble signal is used for preparing reception of data which follows the preamble. The first three preamble pulses S1, S2, and S3 are shown in FIG. 3.

Turning back to FIG. 1, the comparator 40 checks to determine if the output (denoted by 44) of the amplifier section 12 crosses a reference voltage 46 applied via a terminal 46a. If the output 44 does not cross the reference voltage 46, the comparator issues a logic level 0. On the contrary, when the output 44 crosses the reference voltage 46, the comparator generates a logic level 1 which sets the FF 42. Thus, the output 43 of the FF 42 assumes a logic level 1 which turns on the switches 34 and 36.

When the switch 34 is turned on, the resistor 30 is put into a feedback loop and thus, the gain of the inverting amplifier 24 is determined by the two resistors coupled in parallel. It is understood that when the switch remains off, the gain of the inverting amplifier 24 is solely determined by the resistor 28.

Transimpedance gain TG1 of the amplifier 24 when the switch 34 remains off is given by $$TG1 = [A/(A+1)] \cdot R_{28} \quad (1)$$

On the other hand, transimpedance gain TG2 of the amplifier 24 when the switch 34 is closed, is given by $$TG2 = [A/(A+1)] \cdot (R_{28} \times R_{30})/(R_{28}+R_{30}) \quad (2)$$

where A represents the gain of the amplifier 24, $R_{28}$ and $R_{30}$ represent respectively the resistance values of the resistors 28 and 30.

A reset signal 50 is usually transmitted with the optical signal in a manner to be positioned immediately before or after each burst signal.

Generally, the input current signal 22 changes over a wide range from 0.1 µA to as large as 100 µA. It is thus necessary to control the gain of the amplifier 10 over such a large input dynamic range. Assuming that the amplifier 10 is required to generate an output voltage whose amplitude has a value between 50 mV and 500 mV in order to assure correct operations of subsequent circuitry. Assuming further that the gain A of the amplifier 24 is 30, and the resistance values of the resistors 28 and 30 are respectively 40 KΩ and 4.44 KΩ. Under such assumption, the amplifier 24 has an input dynamic range from 1.29 µA to 129 µA. This means that the lower range is undesirably limited.

SUMMARY OF THE INVENTION

It is therefore an object of the present to provide an amplifier for amplifying an electrical signal which has been converted from an optical signal transmitted in burst.

In brief, these objects are achieved by a technique wherein in order to effectively amplify an electrical signal converted from an optical signal, first and second amplifiers are coupled in series. A controller is arranged such as to receive outputs of the first and second amplifiers and to produce first and second control signals based on the outputs. The first and second amplifiers respectively change gains thereof in response to the first and second control signals. The output of the second amplifier is an output of the arrangement.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 4–9.

Figure 4:
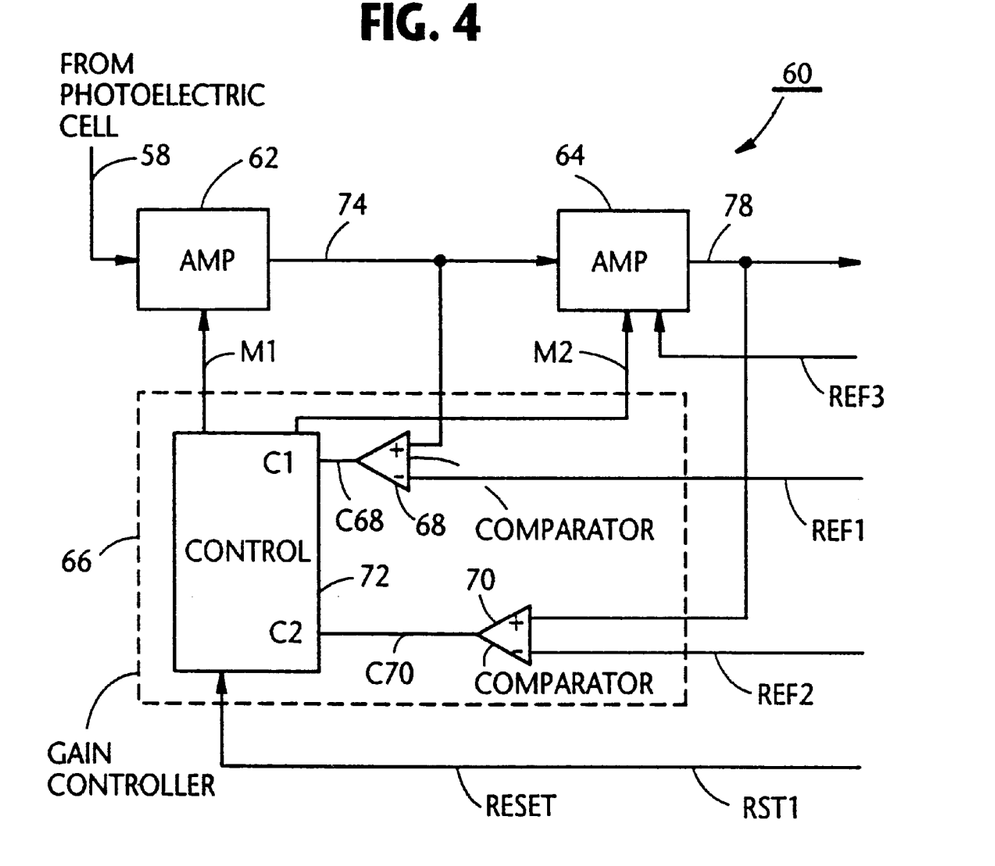
FIG. 4 is a block diagram showing an amplifier, for amplifying an electrical signal converted from an optical signal, according to a first embodiment of the present invention.

Referring to FIG. 4, an amplifier 60 according to the first embodiment is generally illustrated in block diagram form. An electrical current signal 58, which has been converted from an optical signal such as shown in FIGS. 1–3 using a suitable photoelectric cell (not shown), is applied to an inverting amplifier 62 which is coupled in series with another amplifier 64. The voltage outputs of the amplifiers 62 and 64, which are respectively denoted by reference numerals 74 and 78, are applied to a gain controller 66. More specifically, the output 74 is applied to a comparator 68, while the output 78 is applied to another comparator 70.

The comparator 68 compares the output 74 with a reference voltage REF1 and outputs a comparison result signal C68. This signal C68 assumes a logic level 1 when the output 74 crosses the reference voltage REF1 and, otherwise, assumes a logic level 0. In a similar manner, the comparator 70 compares the output 78 with a reference voltage REF2 and outputs a comparison result signal C70. This signal C70 assumes a logic level 1 when the output 74 crosses the reference voltage REF1 and, otherwise, assumes a logic level 0. The comparison result signals C68 and C70 are respectively applied to terminals C1 and C2 of a controller 72. This controller 72 outputs two gain control signals M1 and M2 on the basis of the signals C68 and C70. The amplifier 64 is in fact a differential amplifier which amplifies a voltage difference between the output 74 and a reference voltage REF3. The details of the circuit arrangement of FIG. 4 will be described later with reference to FIG. 9. A reset signal RST1 is usually transmitted.

It is understood that there are four combinations of the signals C68 and C70. However, it is sufficient to use three combinations among the four ones, as will be appreciated later.

Figure 5:
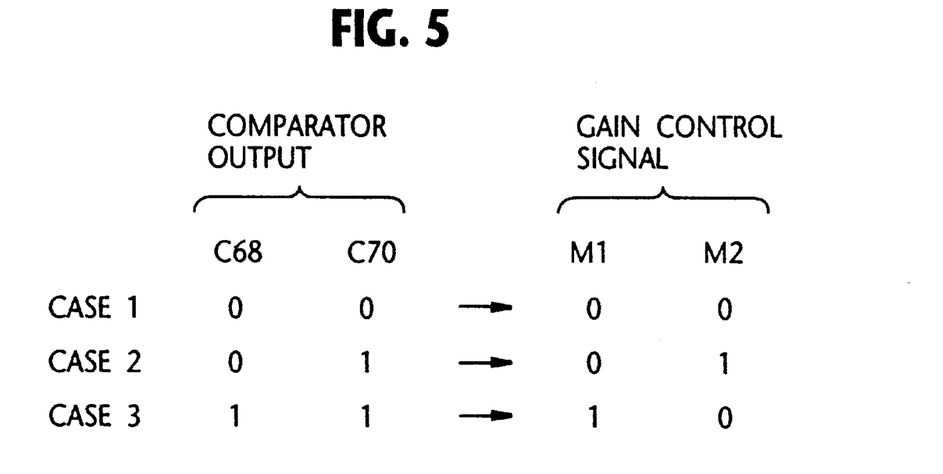
FIG. 5 is a table showing combinations of logic levels of signals appearing in the arrangement of FIG. 4.

FIG. 5 shows a table wherein three cases (denoted by CASE1, CASE 2, and CASE3) are shown in accordance with combinations of the logic levels of signals C68, C70, M1 and M2.

In CASE 1, each of the comparator's outputs C68 and C70 assumes a logic level 0, which means the situation where neither of the amplifier outputs 74 and 78 cross the reference voltages REF1 and REF2, respectively. In other words, this situation implies that the incoming current signal 58 has a small amplitude. Accordingly, there is no need for lowering the gain of each of the amplifiers 62 and 64. Thus, each of the gain control signals M1 and M2 assumes a logic level 0.

CASE 2 means that the incoming current signal 58 has an amplitude to an extent that the amplifier output 78 crosses the reference voltage REF2 while the other output 74 does not cross the reference voltage REF1. It is to be noted that the amplifier 64 magnifies the output 74 which has been amplified. Therefore, it is understood that as the input current signal 58 increases, the output 78 crosses the reference voltage REF2 rather than the output 74 crosses REF1, although this depends on a circuit design. Thus, in CASE 2, the comparator output C68 remains a logic level 0 while the output C70 assumes a logic level 1, and as such, the gain control signals M1 and M2 assume logic levels 0 and 1, respectively. The amplifier 64, in response to the control signal M2, lowers the gain thereof.

CASE 3 means that the incoming current signal 58 further increases, whereby both of the comparator outputs C68 and C70 take a logic level 1. In this instance, it is usually sufficient to lower the gain of the preamplifier 62, leaving the gain of the amplifier 64 unchanged. Thus, the gain control signals M1 and M2 respectively assume logic levels 1 and 0.

The operations of the arrangement shown in FIG. 4 will further be described with reference to FIGS. 6(A)–6(E), 7(A)–7(E), and 8(A)–8(E).

Figure 6A:
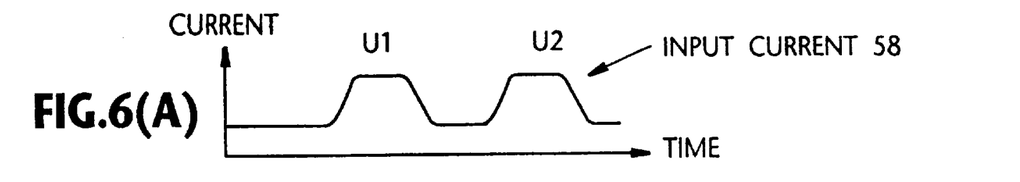
FIGS. 6(A) to 6(E) are each a diagram showing a waveform of a signal associated with the arrangement of FIG. 4 in one situation.
Figure 6B:
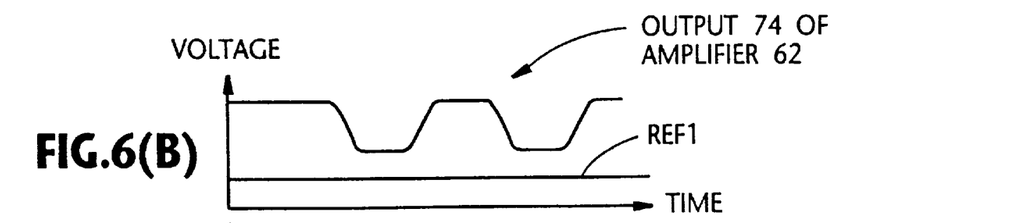
Figure 6C:
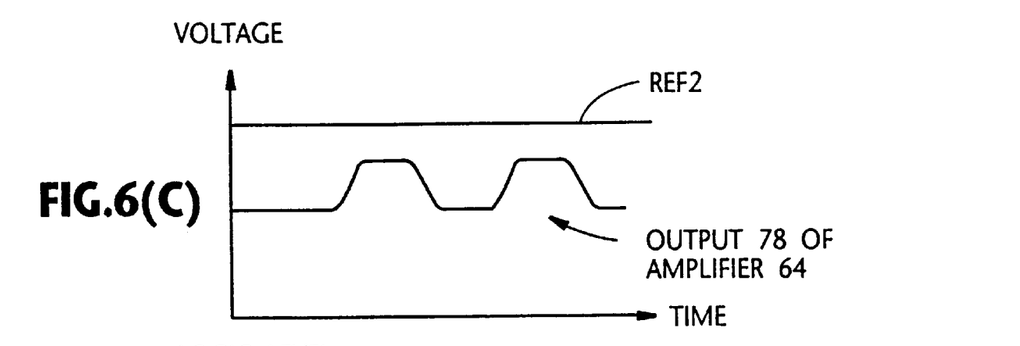
Figure 6D:
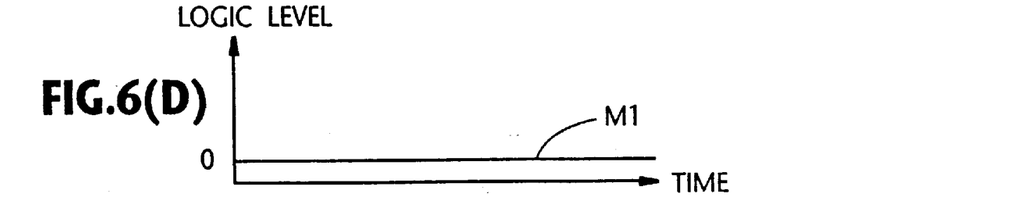
Figure 6E:
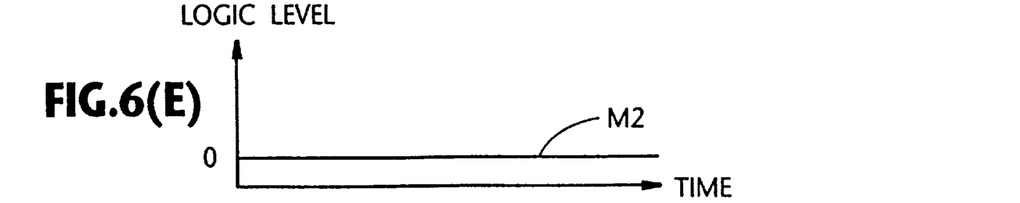

Reference is first made to FIGS. 6(A)–6(E) wherein a plurality of waveforms are shown in CASE 1 of FIG. 5. FIG. 6(A) is a sketch of a waveform of the incoming current signal 58. Notations U1 and U2 are current waveforms which respectively correspond to the optical preamble pulses S1 and S2 of FIG. 3. The current waveforms U1 and U2 are amplified at the inverting amplifier 62 which produces analogous (but phase inverted) voltage waveforms as shown in FIG. 6(B). As mentioned above, the input current signal 58 is small in CASE 1, the amplifier output 74 does not cross the reference voltage REF1. The output 74 is further amplified at the inverting amplifier 64 which produces the output 78 whose waveshape is schematically shown in FIG. 6(C). Also, the amplifier output 78 does not cross the reference voltage REF2. Accordingly, the gain control signals M1 and M1 each assumes a logic level 0 as shown in FIGS. 6(D) and 6(E).

Figure 7A:
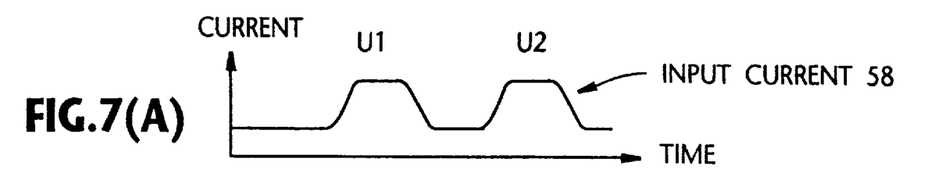
FIGS. 7(A) to 7(E) are each a diagram showing a waveform of a signal associated with the arrangement of FIG. 4 in another situation.
Figure 7B:
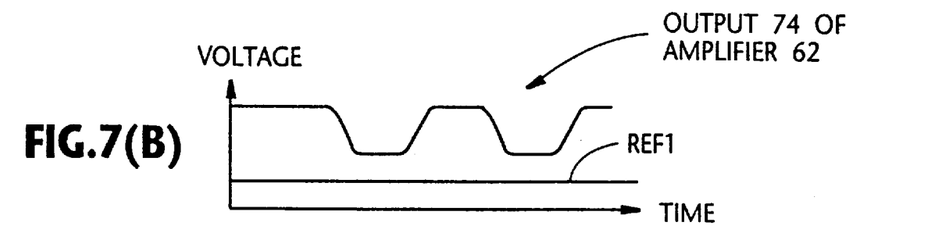
Figure 7C:
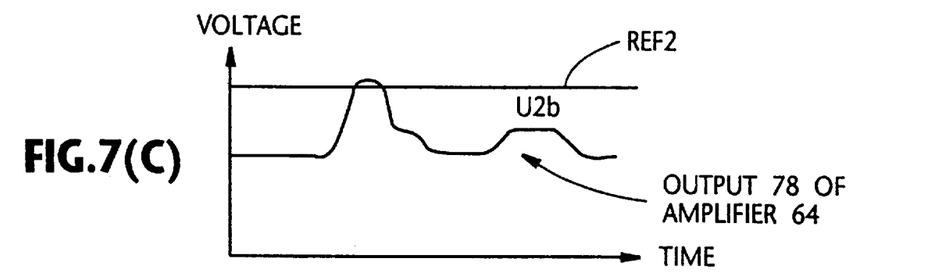
Figure 7D:
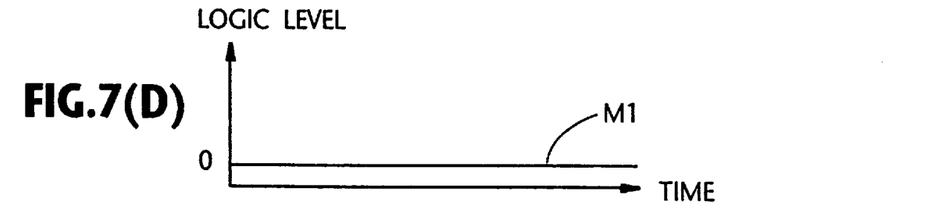
Figure 7E:
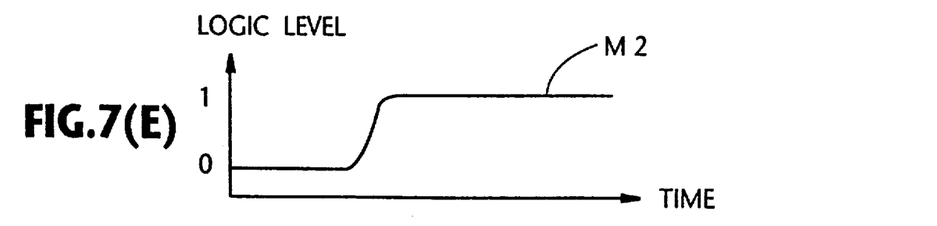

Referring to FIGS. 7(A)–7(D), there are shown waveforms which appear in CASE 2. As mentioned above, CASE 2 means that the amplifier output 78 crosses the reference voltage REF2, the manner of which is shown in FIG. 7(C). Thus, the gain control signal M2 is responsive to the above mentioned situation and changes the logic level thereof from 0 to 1 (FIG. 7(E)). Therefore, the gain of the amplifier 64 is lowered and thus, the second pulse (denoted by U2b corresponding to U2 in FIG. 7(A)) is lowered below the reference voltage REF2 as shown in FIG. 7(C).

Figure 8A:
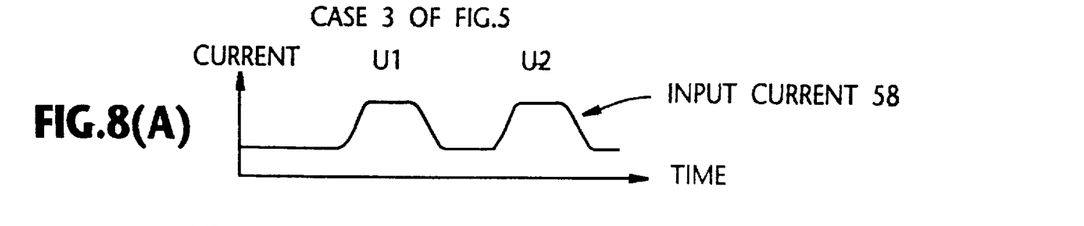
FIGS. 8(A) to 8(E) are each a diagram showing a waveform of a signal associated with the arrangement of FIG. 4 in another situation.
Figure 8B:
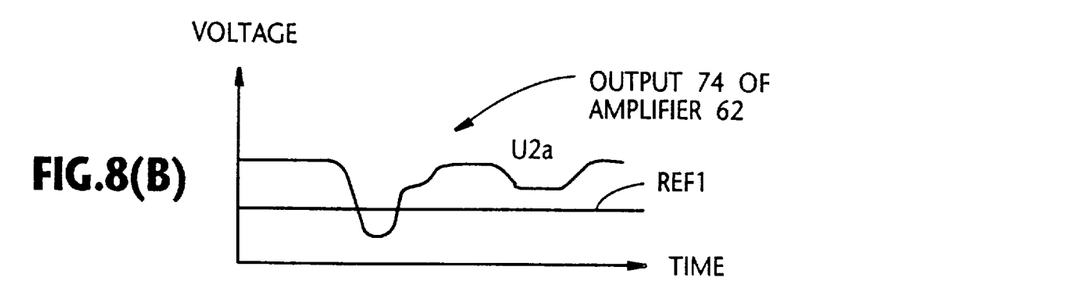
Figure 8C:
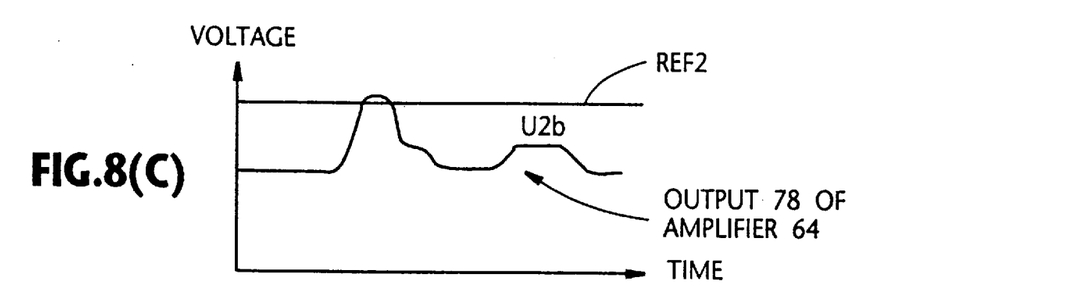
Figure 8D:
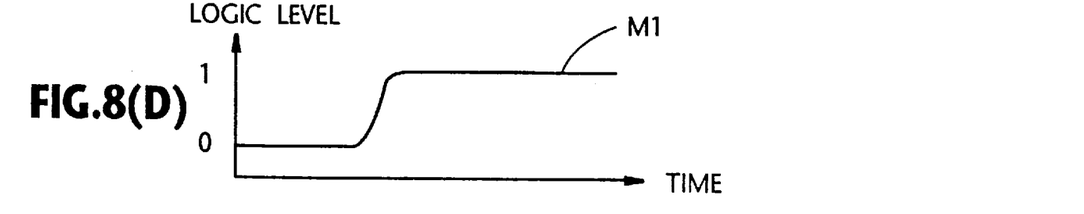
Figure 8E:
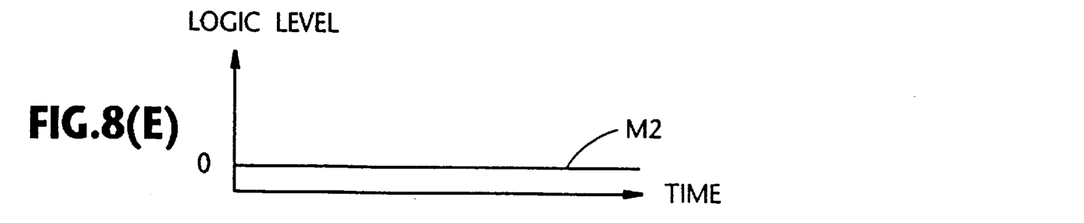

Referring to FIGS. 8(A)–8(D), there are shown waveforms which appear in CASE 3. As mentioned above, CASE 3 means that the amplifier output 74 crosses the reference voltage REF1, the manner of which is shown in FIG. 8(B). Likewise, the amplifier output 78 also crosses the reference voltage REF2 as in CASE 2 (FIG. 8(C)). In CASE 3, however, only the gain control signal M1 is responsive to the above mentioned situation and changes the logic level thereof from 0 to 1 (FIG. 8(D)). Therefore, the gain of the amplifier 62 is lowered and thus, the second pulse (denoted by U2a corresponding to U2 in FIG. 7(A)) is lowered below the reference voltage REF2 as shown in FIG. 8(B). When the gain of the amplifier 62 is lowered, the second pulse U2b of the output 78 is automatically lowered as shown in FIG. 8(C).

It is understood that the amplifier 60 is able to desirably amplify the incoming current signal 58, which has a very wide dynamic range from 0.1 μA to 100 μA (for example), when appropriately selecting two gains of each of the amplifiers 62 and 64.

Figure 9:
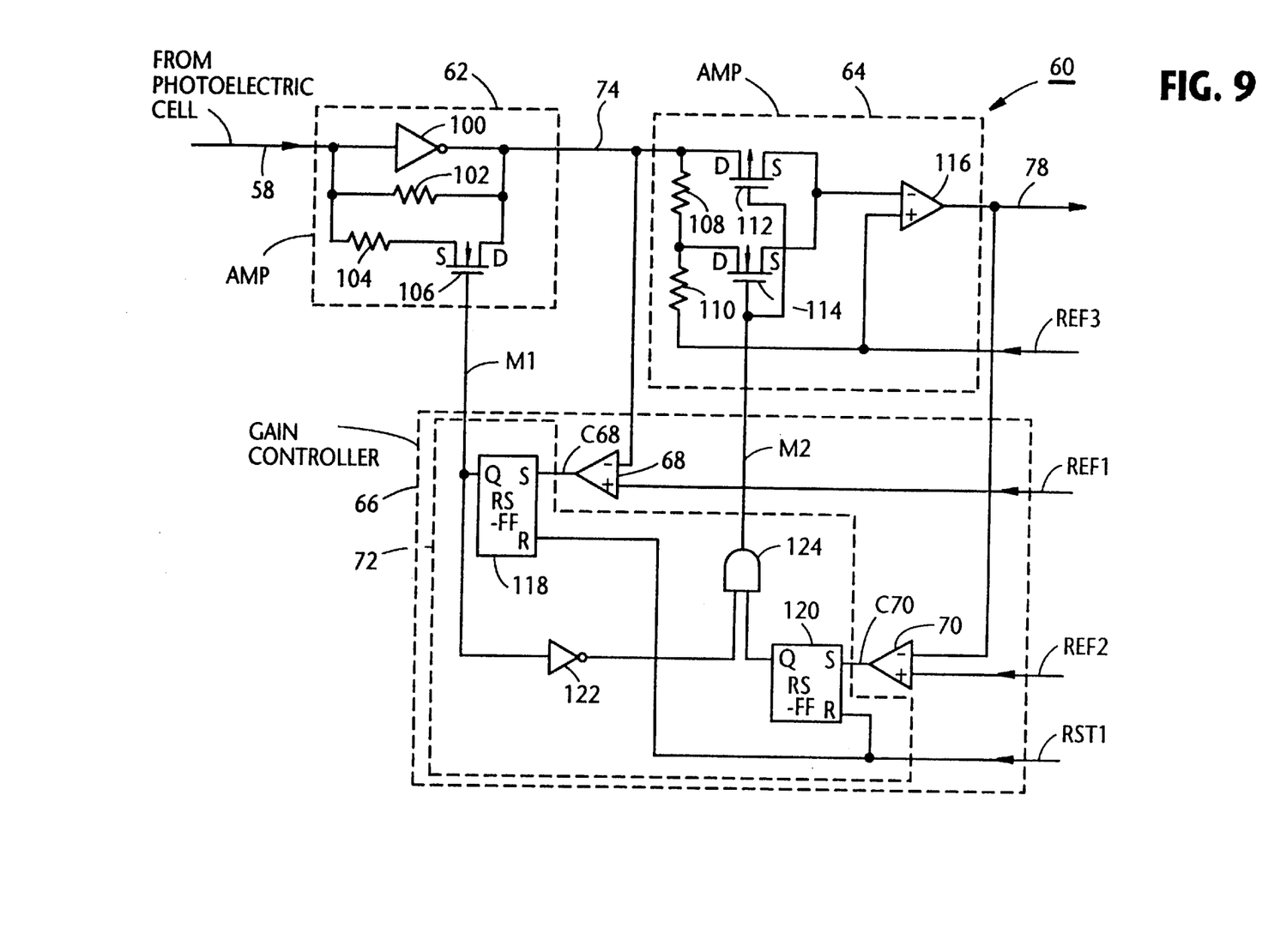
FIG. 9 is a block diagram showing in detail the arrangement of FIG. 4.

FIG. 9 is a block diagram showing in detail the arrangement of FIG. 4. As shown in FIG. 9, the amplifier 62 comprises an inverting amplifier 100, two resistors 102 and 104, and an N-channel MOS transistor 106. On the other hand, the amplifier 64 is comprised of two resistors 108 and 110, a P-channel MOS transistor 112, an N-channel MOS transistor 114, and a differential amplifier 116. Further, the gain controller 66 includes, in addition to the comparators 68 and 70 (already shown in FIG. 4), two set/reset type flip-flops 118 and 120, an inverter 122, and an AND gate 124.

When the incoming current signal 58 is very small such that each of the comparator outputs C68 and C70 assumes a logic level 0, each of the outputs of the flip-flops 118 and 120 is a logic level 0. Thus, the N-channel MOS transistor 106 remains open. On the other hand, since the output of the AND gate 124 is a logic level 0, the P-channel MOS transistor 112 is closed while the N-channel MOS transistor 114 is open. This situation corresponds to the above mentioned CASE 1.

The operations of the arrangement of FIG. 9 in CASE 2 and CASE 3 are clearly understood to those skilled in the art and thus, will be omitted for the sake of simplifying the disclosure. However, it is advantageous to further discuss the operation of the amplifier of FIG. 9 considering concrete values of the elements.

It is assumed that the gain of the amplifier 100 is 30, and the resistance values of the resistors 102 and 104 are respectively 40 KΩ and 0.4 KΩ. Thus, the transimpedance in the case where the switch 106 is "off" (viz., no gain control is performed) is given by equation (1), that is, 38.7 KΩ. On the other hand, the transimpedance in the case where the switch 106 is closed (viz., gain control is carried out) is calculated using equation (2), that is, 0.383 KΩ.

On the other hand, it is assumed that the gain of the differential amplifier 116 is 22.2 dB, and the resistance values of the resistors 108 and 110 are respectively 9 KΩ and 1 KΩ. Then, the gain of the amplifier 64 becomes 22.2 dB when the P- and N-channel transistors 112 and 114 are respectively on and off. On the contrary, when the P- and N-channel transistors 112 and 114 are respectively off and on, the gain of the amplifier 64 becomes 2.2 dB.

Further, assuming that the reference voltages REF1 and REF2 are respectively 387 mV and 500 mV.

Under the above assumption, when each of the amplifiers 62 and 64 exhibits the largest gain, the total gain becomes the maximum of 500 KΩ (=38.7 K Ω×22.2 dB). In more specific terms, when the input current 58 is between 0.1 μA and 1.0 μA), the amplifier outputs 74 and 78 are respectively below 387 mV and 500 mV and thus, no gain control is performed in the amplifiers 62 and 64. On the contrary, when the input current 58 exceeds 1 μA, the output 78 exceeds 500 mV and therefore, the total gain of the amplifier 60 is lowered down to 50 K and maintained until the reset signal RST 1 is applied. Further, when the input current 58 exceeds 10 μA, the output 74 crosses the level of 387 mV and therefore, the total gain of the amplifier 60 is lowered to the minimum value of 5 KΩ. In this case, when the input current 58 is 10 μA, the output voltage of the amplifier 60 becomes 50 mV. Still further, when the input current 58 increases up to 100 μA, the output voltage of the amplifier 60 rises to 500 mV.

It is understood that the first embodiment changes the gains of the serially connected amplifiers 62 and 64 in accordance with the output levels thereof.

A second embodiment of the present invention will be described with reference to FIGS. 10 to 14.

Figure 10:
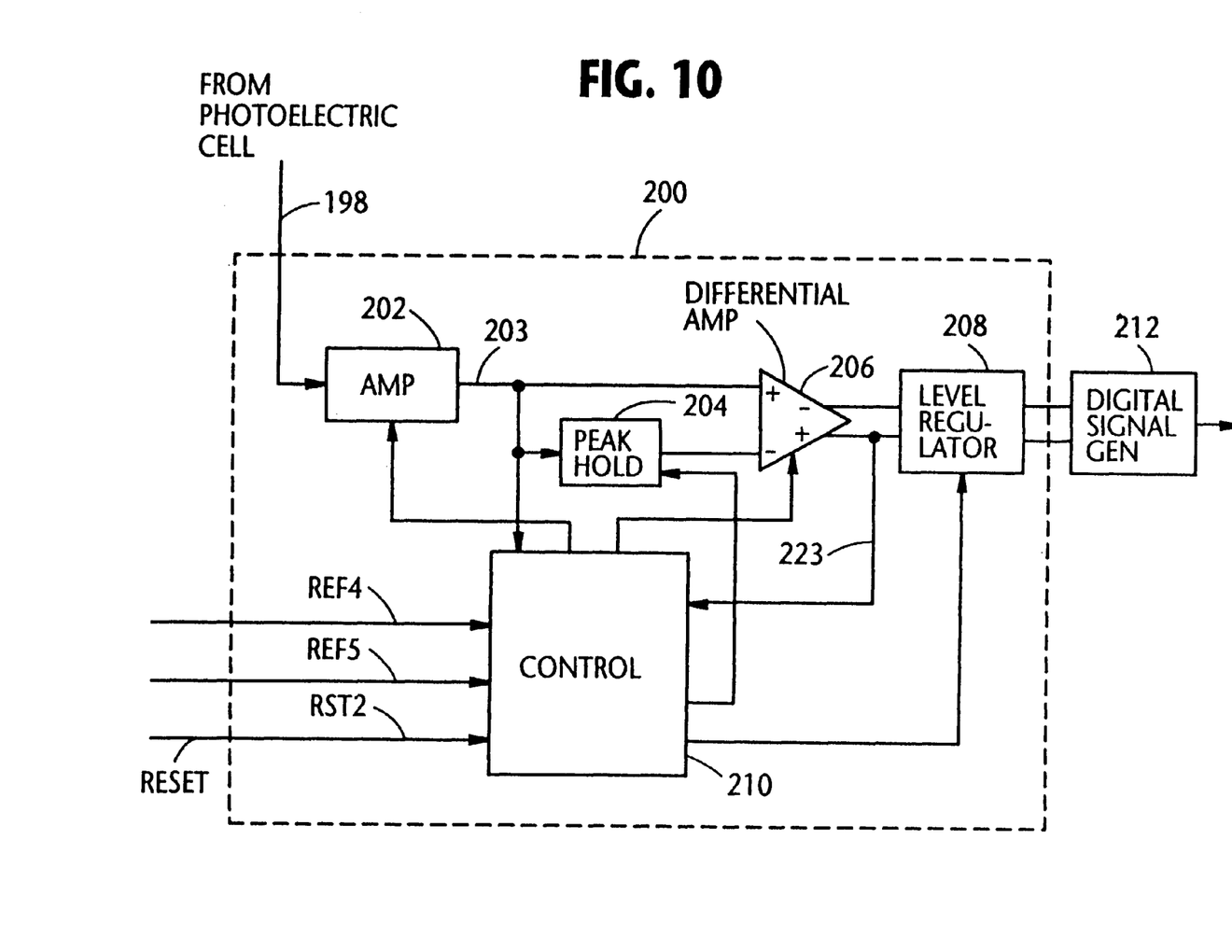
FIG. 10 is a block diagram showing an amplifier, for amplifying an electrical signal converted from an optical signal, according to a second embodiment of the present invention.

FIG. 10 is a block diagram generally showing the configuration of an amplifier (denoted by reference numeral 200) according to the second embodiment. As shown, the amplifier 200 comprises two amplifiers 202 and 206 coupled in series, a peak value holder 204, an output level regulator (or threshold value regulator) 208, and a controller 210. A current input 198 is applied to the amplifier 200 from a suitable photoelectric cell as in the first embodiment. The controller 210 is supplied with reference voltages REF4 and REF5 and a reset signal RST2. A digital signal generator 212 is coupled to the output of the amplifier 200.

The peak value holder 204 corresponds to the reference voltage REF3 in the first embodiment. The peak value stored in the holder 204 is used, as a reference voltage, by the differential amplifier 206. It is preferable to use the peak value as a reference voltage in the case where the amplitude of the input signal varies over a very wide range.

The second embodiment is directed to eliminating a difficulty which occurs when the gain of each of the amplifiers 202 and 206 is changed. More specifically, when the gain is abruptly lowered as mentioned in the first embodiment, the output of each amplifier becomes stable or distorted. This adversely affects the generation of digital signal at the digital signal generator 212. Accordingly, it is highly desirable to eliminate such an unstable situation as quick as possible when it occurs.

Figure 11:
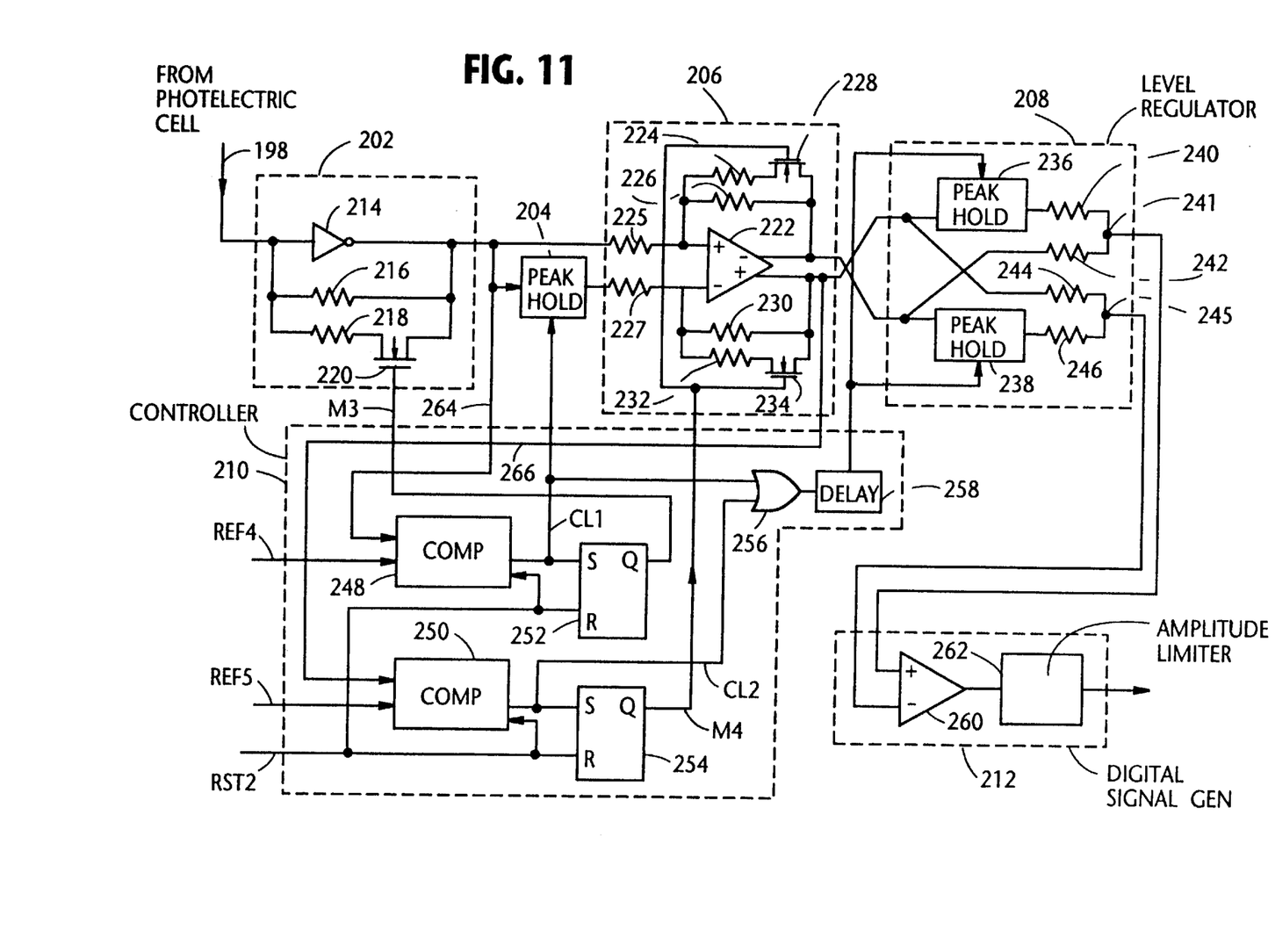
FIG. 11 is a block diagram showing in detail of the arrangement of FIG. 10.

FIG. 11 is a block diagram showing in detail each block of FIG. 10. As shown, the amplifier 202 comprises an inverting amplifier 214, two resistors 216 and 218, an N-channel MOS transistor 220, which are arranged in exactly the same manner as the counterpart of FIG. 9. On the other hand, the amplifier 206 comprises a differential amplifier 222, feedback resistors 224, 226, 230 and 232, two N-channel MOS transistors 228 and 234, and two input resistors 225 and 227, all of which are coupled as illustrated. It is understood that the configuration of the amplifier 206 is very familiar with those skilled in the art.

The level regulator 208 comprises two peak value holders 236 and 238, and four resistors 240, 242, 244, and 246. The peak value holder 236 detects the peak value of a non-inverting output of the differential amplifier 222 and holds same therein. Similarly, the peak value holder 238 detects the peak value of an inverting output of the differential amplifier 222 and stores same therein. That is, the peak value holders 236 and 238 are arranged to hold differential outputs generated from the differential amplifier 222. The peak values of the holders 236 and 238 are added at junctions 241 and 245 to the actual differential values, and thus, the voltage levels at the junctions 241 and 245 are substantially equal with each other. This is very advantageous when regenerating digital signal at the generator 212.

The controller 210 comprises two comparators 248 and 250, two flip-flops 252 and 254, an OR gate 256, and a delay 258. Finally, the digital signal generator 212 includes a differential amplifier 260 and an amplitude limiter 262.

In FIG. 11, the N-channel MOS transistor 220 is rendered on or off in response to a gain control signal M3. Further, N-channel MOS transistors 224 and 234 are rendered on and off in response to a gain control signal M4. A reset (or clear) signal CL1 is used to clear the content of the peak value holder 204. On the other hand, another reset (or clear) signal CL2 is utilized to clear the content of each of the peak value holders 236 and 238.

The operation of the arrangement of FIG. 11, wherein the input current signal 198 is very small and no gain control is performed, is described with reference to FIGS. 12(A) to 12(G).

Figure 12A:
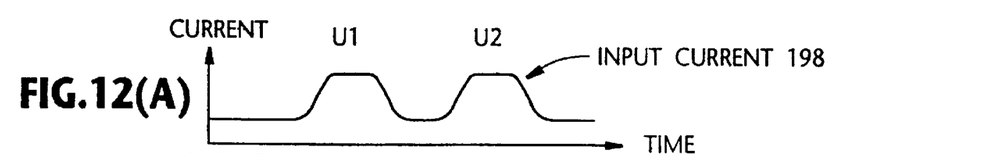
FIGS. 12(A) to 12(G) are each a diagram showing a waveform of a signal associated with the arrangement of FIG. 11 in one situation.
Figure 12B:
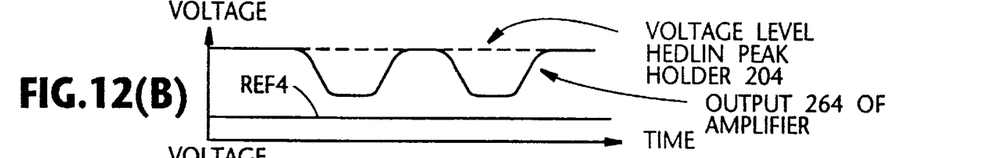
Figure 12C:
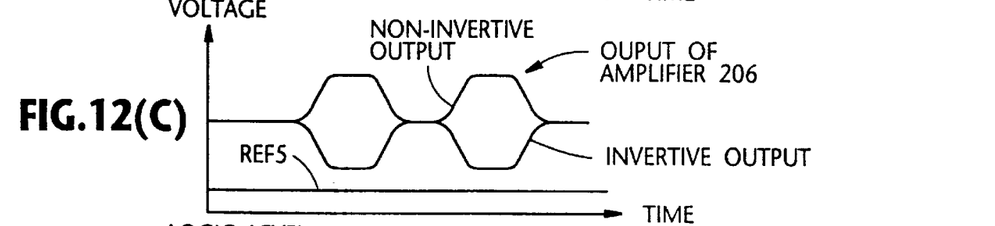
Figure 12D:
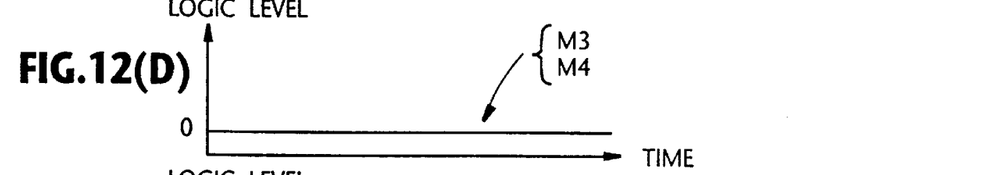
Figure 12E:
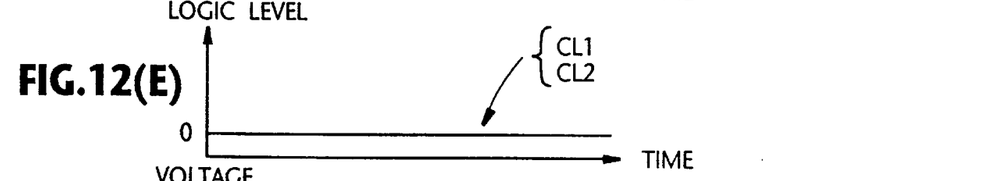
Figure 12F:
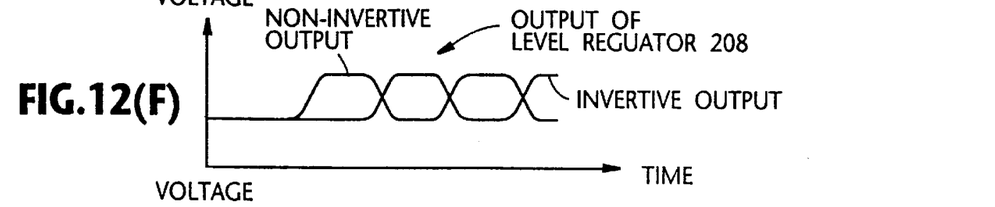
Figure 12G:
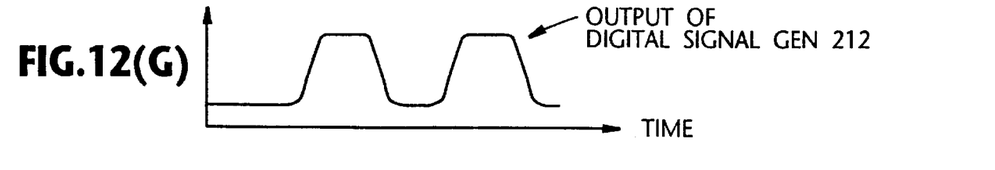

As shown in FIG. 12(B), the output 264 of the amplifier 202 is inverted in terms of phase. The peak value holder 204 holds the upper level shown in a phantom line in the instant case. It is shown in FIG. 12(B) that the output 264 does not cross the reference voltage REF4. FIG. 12(C) shows the differential waveforms of the output of the amplifier 206. FIGS. 12(D) and 12(E) indicate that each of the gain control signals M3 and M4 assumes a logic level 0, and that each of the reset signals CL1 and CL2 also assumes a logic level 0. In this case, as shown in FIG. 12(F), the levels of the non-inverting and inverting voltages, outputted from the level regulator 208, are equal with each other. Thus, the digital signal generator 212 is able to correctly produce a digital signal in response to the first input signal U1.

Turning to FIGS. 13(A) to 13(G). The operation of the arrangement of FIG. 11, wherein the input current signal 198 is somewhat high and a gain control is performed at the amplifier 206, is described. It is to be noted that FIGS. 13(A) to 13(G) respectively correspond to FIGS. 12(A) to 12(G).

Figure 13A:
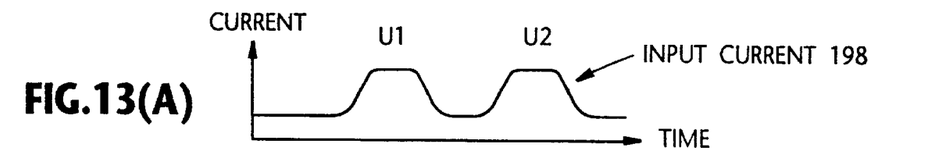
FIGS. 13(A) to 13(G) are each a diagram showing a waveform of a signal associated with the arrangement of FIG. 11 in another situation.
Figure 13B:
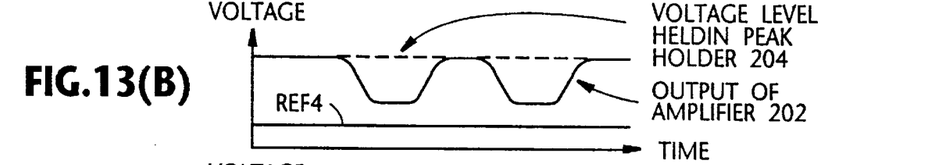
Figure 13C:
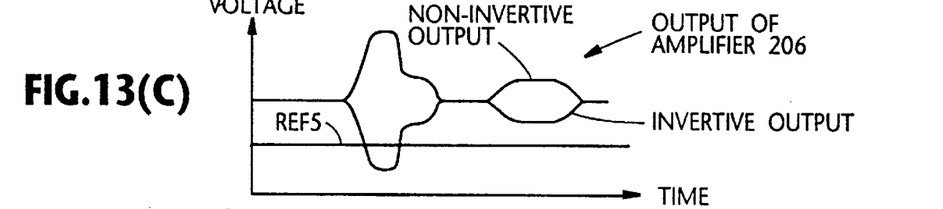
Figure 13D:
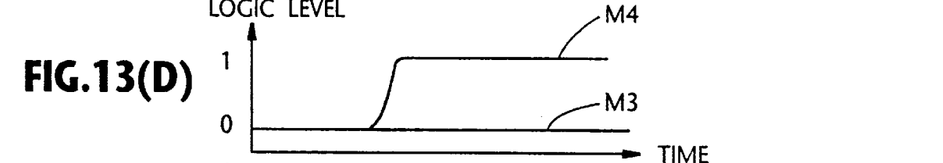
Figure 13E:
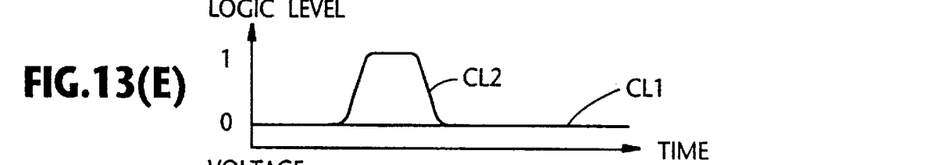
Figure 13F:
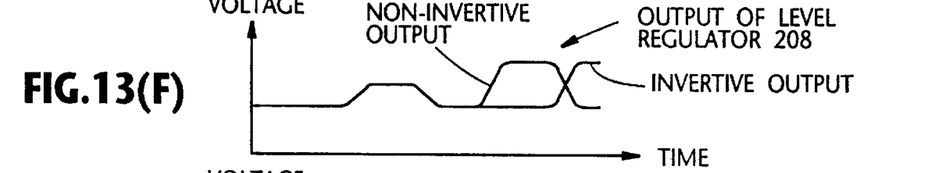
Figure 13G:
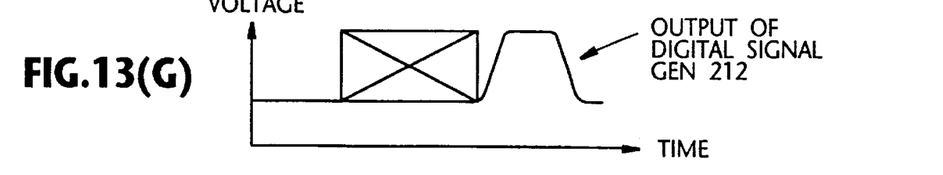

As shown in FIG. 13(C), the inverted output of the amplifier 206 crosses the reference voltage REF5. Each of the gain control signal M4 and the reset signal CL2 is responsive to such a situation and assumes a logic level 1. Thus, the gain of the amplifier 206 is abruptly lowered as shown in FIG. 13(C) and as such, it is necessary to reset the peak value holders 236 and 238. To this end, the reset signal CL2 is applied to the holders 236 and 238. Accordingly, as shown in FIG. 13(F), the level regulator 208 outputs a normal signal from the second signal which corresponds to the input signal U2. In FIG. 13(G), a box including "x" therein means that the signal for this time duration is uncertain.

Referring to FIGS. 14(A) to 14(G). The operation of the arrangement of FIG. 11, wherein the input current signal 198 is high and a gain control is performed at the amplifier 202, is described. FIGS. 14(A) to 14(G) respectively correspond to FIGS. 12(A) to 12(G).

Figure 14A:
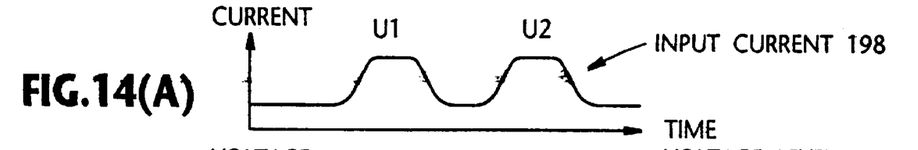
FIGS. 14(A) to 14(G) are each a diagram showing a waveform of a signal associated with the arrangement of FIG. 11 in another situation.
Figure 14B:
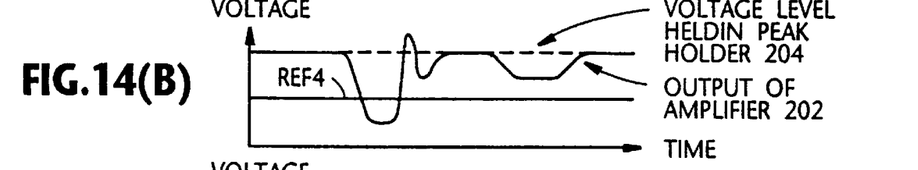
Figure 14C:
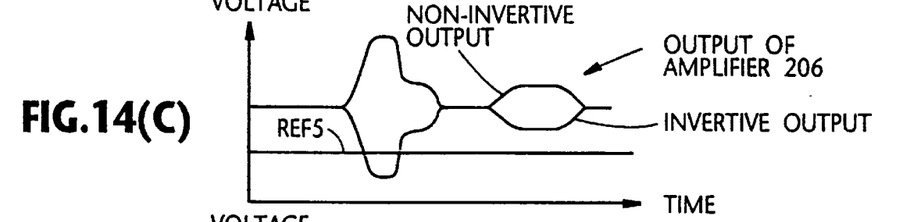
Figure 14D:
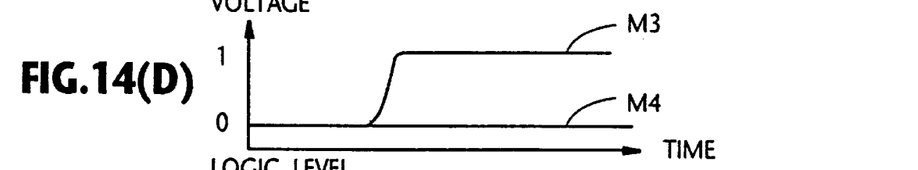
Figure 14E:
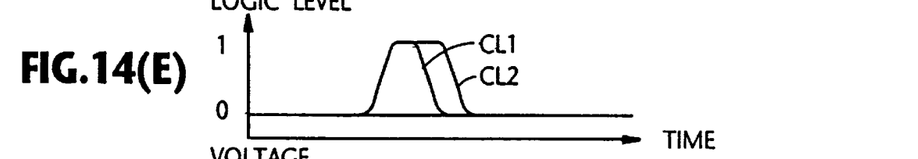
Figure 14F:
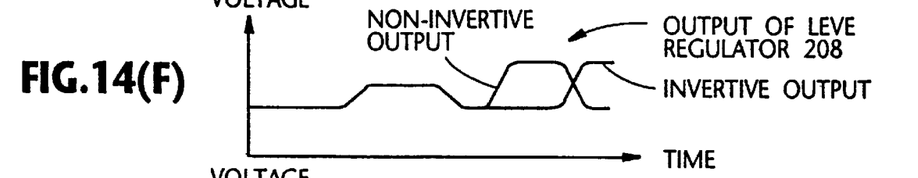
Figure 14G:
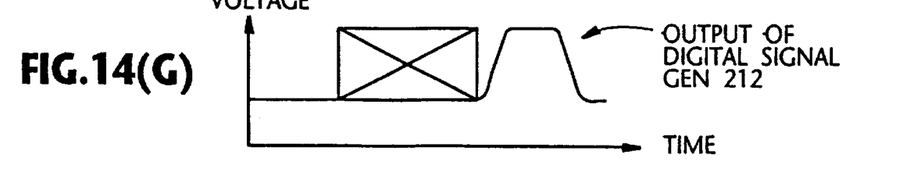

As shown in FIG. 14(B), the inverted output of the amplifier 202 crosses the reference voltage REF4. Each of the gain control signal M3 and the reset signals CL1 and CL2 is responsive to such a situation and assumes a logic level 1. Thus, the gain of the amplifier 202 is abruptly lowered as shown in FIG. 14(B) and as such, it is necessary to reset the peak value holders 204, 236 and 238. To this end, the reset signal CL1 is applied to the peak value holder 204 while the reset signal CL2 are applied to the holders 236 and 238. Accordingly, as shown in FIG. 14(F), the level regulator 208 outputs a normal signal from the second signal which corresponds to the input signal U2. As mentioned above, a box including "x" therein in FIG. 14(G) means that the signal for this time duration is uncertain.

In the above, the delay circuit 258 is configured such that the trailing edge of the reset signal CL2 is delayed to expand the reset time duration.

It will be understood that the above disclosure is representative of only two possible embodiments of the present invention and that the concept on which the invention is based is not specifically limited thereto.

What is claimed is:

1. An arrangement for amplifying an electrical signal converted from an optical signal, comprising:

first and second amplifiers coupled in series;

a controller arranged such as to receive outputs of said first and second amplifiers, and producing first and second control signals based on the outputs, wherein said first and second amplifiers respectively change gains thereof in response to the first and second control signals and wherein the output of said second amplifier is always an output of said arrangement.

2. An arrangement as claimed in claim 1, wherein said first amplifier comprises:

a feedback amplifier;

first and second feedback resistors which determine a gain of said feedback amplifier; and switching means for selectively inserting and removing said first and second feedback resistors from said arrangement in response to the first control signal.

3. An arrangement as claimed in claim 1, wherein said second amplifier comprises:

a voltage amplifier;

first and second resistors for determining a gain of said voltage amplifier; and first and second switch means for respectively inserting and removing said first and second resistors in response to said second control signal.

4. An arrangement for amplifying an electrical signal converted from an optical signal, comprising:

first and second amplifiers coupled in series;

a controller arranged such as to receive outputs of said first and second amplifiers, and producing first and second control signals based on the outputs, wherein said first and second amplifiers respectively change gains thereof in response to the first and second control signals and wherein the output of said second amplifier is an output of said arrangement and, wherein said controller comprises:

a first comparator for comparing the output of said first amplifier with a first reference voltage;

a second comparator for comparing the output of said first amplifier with a second reference voltage;

a first set/reset type flip-flop for which an output of said first comparator is applied;

a second set/reset type flip-flop for which an output of said second comparator is applied;

an inverter coupled to an output terminal of said first set/reset type flip-flop; and an AND gate for receiving outputs of said inverter and said second set/reset type flip-flop, wherein the output of said first set/reset type flip-flop is used as the first control signal and the output of said AND gate is used as the second control signal.

5. An arrangement for amplifying an electrical signal converted from an optical signal, comprising:

first and second amplifiers coupled in series;

a controller arranged such as to receive outputs of said first and second amplifiers, and producing first and second control signals based on the outputs, wherein said first and second amplifiers respectively change gains thereof in response to the first and second control signals and wherein the output of said second amplifier is an output of said arrangement, wherein said optical signal is transmitted in burst, and wherein said controller receives a voltage signal positioned in a front portion of a burst signal, producing said first and second control signals, and resetting said first and second control signals after or before the burst signal.

6. An arrangement for amplifying an electrical signal converted from an optical signal, comprising:

a first amplifier to which the electrical signal is applied;

a peak value holder coupled to hold a value of an output signal of said amplifier;

a second amplifier, said second amplifier having a first input terminal to which the output signal of said first amplifier is applied and a second input terminal to which the value stored in said peak value holder is applied;

a level regulator coupled to receive differential outputs of said second amplifier and operating so as to substantially equalize said differential outputs; and a controller arranged such as to receive outputs of said first and second amplifiers and producing first and second control signals based on the outputs;

wherein said first and second amplifiers respectively change gains thereof in response to the first and second control signals, and wherein said controller terminates the operation of said level regulator for a predetermined time interval when said controller changes the gain of said first amplifier and/or the gain of said second amplifier.

7. An arrangement as claimed in claim 6, wherein said first amplifier comprises:

a feedback amplifier;

first and second feedback resistors which determine a gain of said feedback amplifier; and switching means for selectively inserting and removing said first and second feedback resistors from said arrangement in response to the first control signal.

8. An arrangement as claimed in claim 6, wherein said controller terminates the operation of said peak value holder when said controller changes the gain of said first amplifier.

9. An arrangement as claimed in claim 6, wherein said level regulator is provided with peak value holding means for holding the differential outputs of said second amplifier, and wherein said controller terminates said peak value holding means for a predetermined time interval when said controller changes the gains of said first and second amplifiers.

* * * * *